(12) United States Patent
Kim et al.

(10) Patent No.: US 7,709,389 B2
(45) Date of Patent: May 4, 2010

(54) METHOD OF FABRICATING A SEMICONDUCTOR DEVICE

(75) Inventors: Dong-chan Kim, Seoul (KR);
Chang-jin Kang, Seongnam-si (KR);
Kyeong-koo Chi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 574 days.

(21) Appl. No.: 11/480,545

(22) Filed: Jul. 5, 2006

(65) Prior Publication Data

US 2007/0009840 A1 Jan. 11, 2007

(30) Foreign Application Priority Data

Jul. 6, 2005 (KR) ...................... 10-2005-0060796

(51) Int. Cl.
*H01L 21/302* (2006.01)

(52) U.S. Cl. ...................... 438/696; 438/700; 438/736; 438/947; 216/46; 216/47

(58) Field of Classification Search ...................... 216/46
See application file for complete search history.

(56) References Cited

U.S. PATENT DOCUMENTS

| | | | | |
|---|---|---|---|---|
| 4,707,218 A | * | 11/1987 | Giammarco et al. | 438/421 |
| 4,849,069 A | * | 7/1989 | Evans et al. | 438/619 |
| 5,593,813 A | * | 1/1997 | Kim | 430/312 |
| 5,698,112 A | * | 12/1997 | Naeher et al. | 216/2 |
| 6,518,147 B1 | * | 2/2003 | Villa et al. | 438/429 |
| 6,521,538 B2 | * | 2/2003 | Soga et al. | 438/695 |
| 6,740,933 B2 | * | 5/2004 | Yoo et al. | 257/347 |
| 7,326,650 B2 | * | 2/2008 | Kihara et al. | 438/700 |
| 2005/0121710 A1 | * | 6/2005 | Shino | 257/296 |
| 2005/0287772 A1 | * | 12/2005 | Schlosser et al. | 438/483 |
| 2007/0035200 A1 | * | 2/2007 | Casset et al. | 310/309 |
| 2007/0290192 A1 | * | 12/2007 | Rotondaro | 257/19 |

FOREIGN PATENT DOCUMENTS

| | | |
|---|---|---|
| JP | 06-061191 | 3/1994 |
| JP | 2002-280392 | 9/2002 |
| KR | 1020010063264 | 7/2001 |
| KR | 1020040036478 | 4/2004 |
| KR | 2005031677 A * | 4/2005 |
| KR | 1020050031677 | 4/2005 |
| KR | 1020050068363 | 7/2005 |

* cited by examiner

*Primary Examiner*—Anita K Alanko
(74) *Attorney, Agent, or Firm*—Volentine & Whitt, PLLC (57) ABSTRACT

A method of fabricating a semiconductor device comprising a method of forming an etching mask used for etching a semiconductor base material is disclosed. The method of fabricating a semiconductor device comprises forming hard mask patterns on a semiconductor base material; forming material layers covering the lateral and top surfaces of the hard mask patterns to form openings between adjacent hard mask patterns, wherein the width of each opening is smaller than the distance between adjacent hard mask patterns; and etching the semiconductor base material using the hard mask patterns and material layers as an etching mask.

16 Claims, 7 Drawing Sheets

FIG. 17

METHOD OF FABRICATING A SEMICONDUCTOR DEVICE

BACKGROUND OF THE INVENTION

1. Field of the Invention

Embodiments of the invention relate to a method of fabricating a semiconductor device. In particular, embodiments of the invention relate to a method of fabricating a semiconductor device comprising forming an etching mask.

This application claims priority to Korean Patent Application No. 10-2005-0060796, filed on Jul. 6, 2005, the subject matter of which is hereby incorporated by reference in its entirety.

2. Description of the Related Art

As semiconductor devices have become more highly integrated, the distances separating elements of a semiconductor device have become increasingly small. These elements are generally formed through the use of a micro-pattern. The micro-pattern is used to variously etch thin material layers and is formed using photolithography techniques. Thus, the precision with which photolithography techniques are applied is an important factor in the resulting quality of the micro-pattern.

In conventional photolithography techniques, a pattern for use as an etching mask, for example, is exposed on a photosensitive material layer using KrF laser projecting light at a wavelength of 248 nm or ArF laser projecting light at a wavelength of 193 nm. Following exposure to light at these respective wavelengths the photosensitive material layer is developed. Once the photosensitive material layer is developed, a subsequently applied etching process is used to form the desired micro-pattern on a lower layer (i.e., a layer formed below the resist pattern) as a result of an etch selectivity between the resist pattern and the lower layer.

However, as semiconductor devices become more highly integrated, the number and complexity of the constituent fabrication processes increases. Also, as the line width and similar separation distances between elements on contemporary semiconductor devices decreases, the usefulness of conventional photolithography equipment and techniques becomes increasingly strained. This is particularly true for the lasers conventionally used in the development of micro-patterns. The performance limitations currently being experienced with regard to conventional equipment are a result of the optical characteristics for the constituent light sources and/or the associated chemical characteristics of certain materials commonly used in conventional photolithography processes.

To overcome some of these limitations, a silicon nitride layer or a polysilicon layer has been formed on an etching target layer and used as an etching mask to form a micro-pattern. A hard material layer other than a photosensitive material used as an etching mask is commonly referred to as a hard mask (or hard mask pattern).

As the design rule for semiconductor fabrication processes falls below 100 nm, many of these processes require increasingly small critical dimensions (CDs). Examples of such processes include those related to the formation of a recess channel array transistor (RCAT), a self aligned contact plug (SAC), a storage node contact plug, a DRAM capacitor, and a contact plug in a flash device. In addition, small CDs are typically obtained using a photolithography process and an associated etching process. In typical processes related to the fabrication of semiconductor devices such as DRAMs or flash devices, a design rule of about 90 nm is used for mass production, while a design rule of 50 nm is currently being researched. One of the most important factors in developing such devices having small design rules is the patterning of small CDs using photolithography and etching processes. In particular, the photolithography process should be accomplished first so that the following etching process may be evaluated. However, the development of a scanner, which is a piece of exposure equipment, is lagging behind the reduction of the design rule in a semiconductor device.

For example, in a process for forming an RCAT of a DRAM, where the CD of a space formed in the process (i.e., the width of a trench in which a buried gate will be formed) should be less than 40 nm, a plurality of bridges are generated due to the scanner's resolution limit. In addition, in a process for forming an SAC, contact holes are not correctly formed (i.e., are not open) due to a bridge caused by scum. In a process for forming a contact plug in a flash device, when the CD of a space (i.e., the width of a contact hole where the contact plug will be formed) should be less than 60 nm, scum often causes contact holes to be formed incorrectly (i.e., causes non-open defects). Thus, alternative approaches such as a sidewall patterning technique or a double exposure technique have been introduced for patterning small CDs. However, these alternate fabrication techniques are expensive, complicated, and more time consuming.

SUMMARY OF THE INVENTION

The present invention provides a method of fabricating a semiconductor device comprising relatively simple process for forming a critical dimension (CD) that is smaller than the smallest CD that can be formed using conventional photolithography.

In one embodiment, the invention provides a method of fabricating a semiconductor device comprising forming hard mask patterns on a semiconductor base material; forming material layers covering the lateral and top surfaces of the hard mask patterns to form openings between adjacent hard mask patterns, wherein the width of each opening is smaller than the distance between adjacent hard mask patterns; and etching the semiconductor base material using the hard mask patterns and material layers as an etching mask.

In another embodiment, the invention provides a method of fabricating a semiconductor device comprising forming hard mask patterns comprising silicon on a semiconductor base material; forming material layers covering the lateral and top surfaces of the hard mask patterns using SEG to form openings between adjacent hard mask patterns, wherein the width of each opening is smaller than the distance between adjacent hard mask patterns; and etching the semiconductor base material using the hard mask patterns and material layers as an etching mask.

BRIEF DESCRIPTION OF THE DRAWINGS

Exemplary embodiments of the present invention will be described herein with reference to the accompanying drawings, in which like reference symbols indicate like or similar elements. In the drawings.

DESCRIPTION OF THE EXEMPLARY EMBODIMENTS

In the drawings, the forms of elements are exaggerated for clarity. As used herein, when a first element is described as being "on" a second element, the first element may be directly on the second element, or intervening elements may be present.

Figure 1:
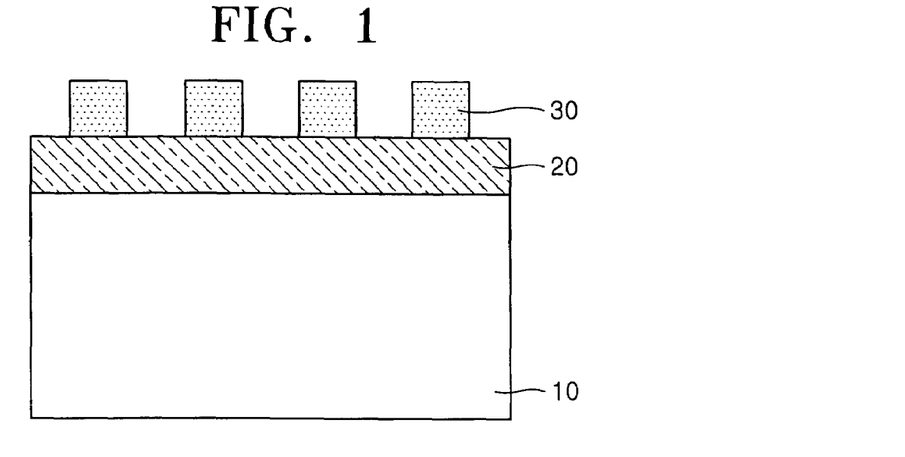
FIGS. 1 through 4 are cross-sectional views illustrating a method of fabricating a semiconductor device in accordance with an exemplary embodiment of the present invention.

FIGS. 1 through 4 are cross-sectional views illustrating a method for fabricating a semiconductor device in accordance with an exemplary embodiment of the present invention. Referring to FIG. 1, a hard mask layer 20 is formed on a semiconductor base material 10. The semiconductor base material 10 may be, for example, a semiconductor substrate, an insulation layer such as a silicon dioxide layer formed on a semiconductor substrate, or a conductive layer such as an impurity-doped polysilicon layer. However, the present invention is not limited to a semiconductor base material, but rather any base material on which a hard mask layer can be formed may be used. The semiconductor substrate and any additional stacked layers formed beneath the hard mask layer (or hard mask patterns) will be collectively referred to herein as a semiconductor base material.

In the illustrated embodiment, hard mask layer 20 comprises silicon and is used as a growth seed for forming a silicon (Si) or silicon germanium (SiGe) epi-layer, which will be described subsequently. Hard mask layer 20 may be formed by, for example, depositing Si or SiGe. The Si may be, for example, single crystal, polycrystal, or amorphous Si, and the SiGe may be, for example, single crystal, polycrystal, or amorphous SiGe. In the illustrated embodiment, the deposition is performed using low pressure chemical vapor deposition (LPCVD).

When SiGe is deposited to form hard mask layer 20, $GeH_4$, or $GeF_4$, a silane group gas such as $SiH_4$, $Si_2H_6$, or $SiH_2Cl_2$ may be used as source gasses. The Ge content of the SiGe is not specifically fixed and can be controlled by adjusting the flow rate of the Ge source gas. Factors that can be considered when setting the Ge content of the SiGe are the fact that the SiGe should not be excessively etched when semiconductor base material 10 is etched, and the fact that the SiGe has an etch selectivity with respect to semiconductor base material 10 when removing the SiGe after etching semiconductor base material 10. Thus, the Ge content of the SiGe is not fixed but can be optimized for each process.

Next, a resist is formed on hard mask layer 20. For example, hexamethyidisilazane (HMDS) may be applied to hard mask layer 20. The resist is applied to the entire wafer by rotating the wafer at about 3000 rpm, and then pre-baking is performed at 120° C. for 90 seconds to evaporate a solvent from the resist. The resulting resist is then exposed and developed using a mask to form resist patterns 30. The exposure is performed using a light source having a wavelength to which the resist responds. If necessary, post-baking is performed at 120° C. for 90 seconds to enhance the resist resolution. Development is then performed for about 60 seconds using a developing solution such as a tetramethylammonium hydroxide (TMAH) solution.

Figure 2:
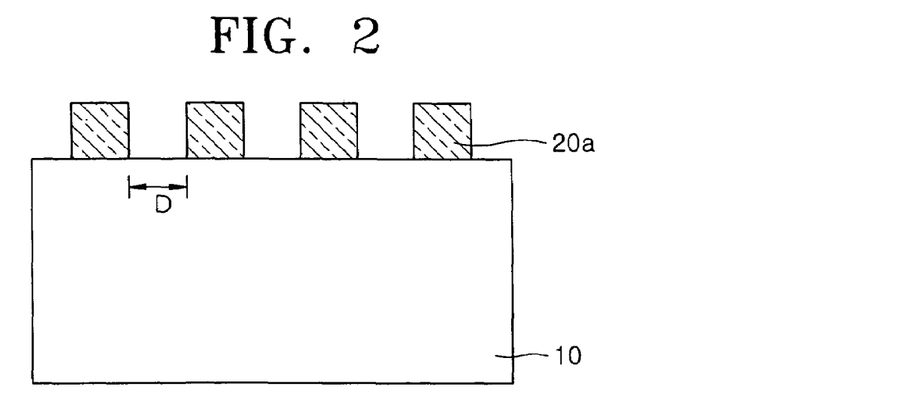

Referring to FIGS. 1 and 2, hard mask layer 20 is etched using resist patterns 30 as an etching mask to form hard mask patterns 20a, wherein adjacent hard mask patterns 20a are separated by a distance D. Resist patterns 30 are then removed through ashing and stripping. In the illustrated embodiment, hard mask layer 20, formed from Si or SiGe, is etched through dry etching using a mixed gas comprising $HBr$, $HeO_2$, $N_2$, and $CF_4$ or using a plasma in order to improve the etching profile and reduce processing time.

Figure 3:
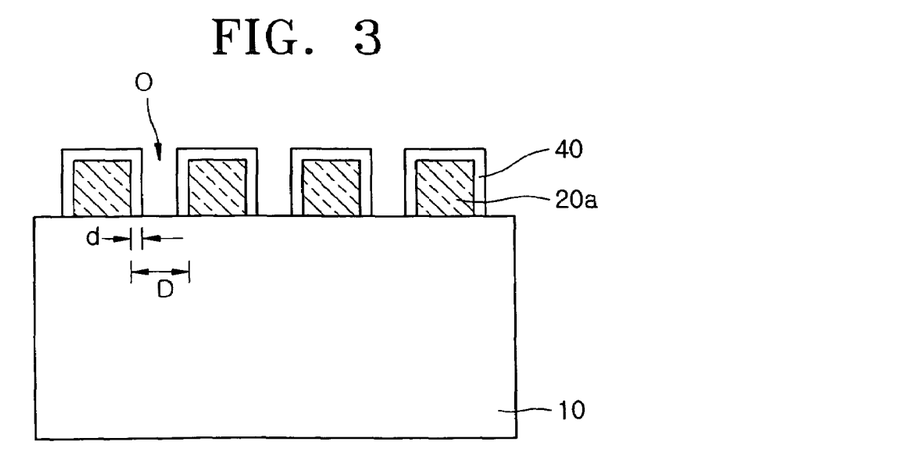

Referring to FIG. 3, material layers 40 covering lateral and top surfaces of hard mask patterns 20a are formed. Material layers 40 covering hard mask patterns 20a, which comprise Si or SiGe, may be Si layers or SiGe layers. In the illustrated embodiment, the Si or SiGe layers are formed using selective epitaxial growth (SEG). SEG can be performed under low pressure (LP), wherein the pressure range is 20 to 120 Torr, or ultra high vacuum (UHV), wherein the pressure range is up to $10^{-8}$ Torr. SEG may be performed at a temperature between 600 and 900° C. A gas comprising a combination of dichlorosilane (DCS), $SiH_4$, $HCl$, $Cl_2$, and $H_2$ may be used for the SEG. In SEG, single crystal Si can be grown on single crystal Si and polycrystal Si can be grown on polycrystal Si. Also, polycrystal Si generally grows faster than single crystal Si in SEG. In the illustrated embodiment, material layers 40 formed on the lateral and top surfaces of hard mask patterns 20a have uniform thicknesses.

Openings O are formed on semiconductor base material 10 through the formation of material layers 40. The width of each opening O (i.e., the distance between material layers 40 formed on adjacent hard mask patterns 20a) is smaller than the distance D between adjacent hard mask patterns 20a. If the thickness d of each material layer 40 is uniform on the lateral and top surfaces of hard mask patterns 20a, the critical dimension (CD) of each opening O, defined by hard mask patterns 20a and material layers 40, is (D−2d). Accordingly, though hard mask patterns 20a are formed such that adjacent hard mask patterns 20a are separated by distance D, which corresponds to the upper limit of photolithography resolution (i.e., corresponds to the smallest separation that can be correctly formed through photolithography), material layers 40 covering hard mask patterns 20a are formed to thereby form openings O that each provide a CD narrower than distance D. The thicknesses of material layers 40 may be controlled precisely to obtain a desired CD narrower than distance D.

Since SEG occurs in a z-direction, i.e., in a direction perpendicular to the upper surface of semiconductor base material 10, the thicknesses of hard mask patterns 20a may be large. This brings an increased process margin because the thickness of an etching mask increases when semiconductor base material 10 is etched.

Figure 4:
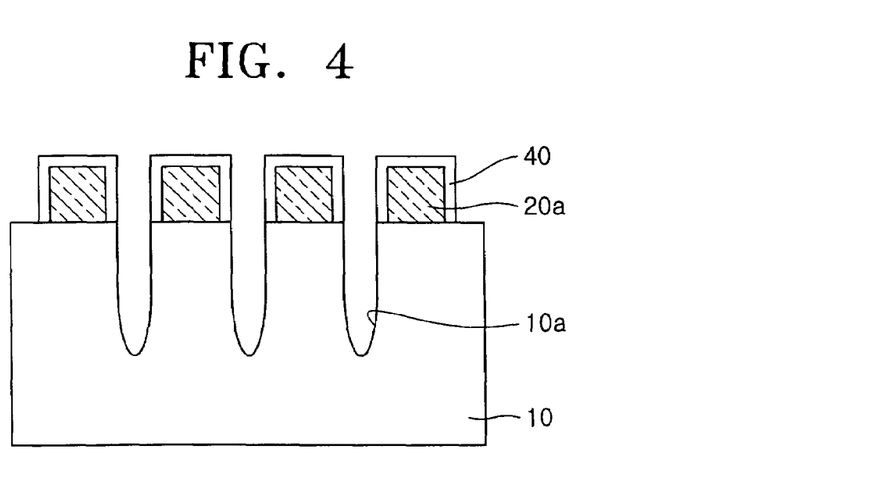

Referring to FIG. 4, semiconductor base material 10 is etched using hard mask patterns 20a covered by material layers 40 as an etching mask. In FIG. 4, semiconductor base material 10 is etched to a defined depth to form grooves 10a, for example. Grooves 10a may, for example, be filled with metal wires using a damascene method in a subsequent process.

As described above, the illustrated method, in accordance with an exemplary embodiment of the present invention, can form a small CD that is equal to distance D, which corresponds to the upper limit of photolithography resolution, minus twice the thickness of a material layer (i.e., thickness d). This CD can be formed by patterning a hard mask layer to form hard mask patterns wherein adjacent hard mask patterns are separated by distance D, and then forming the material layer to cover the hard mask patterns.

FIGS. 5 through 10 are cross-sectional views illustrating a method for fabricating a semiconductor device in accordance with another exemplary embodiment of the present invention. A method of forming an RCAT in a DRAM will be described as an exemplary embodiment of the present invention with reference to FIGS. 5 through 10. Description of processes that are substantially the same as those described previously with reference to FIGS. 1 through 4 may be omitted here.

Figure 5:
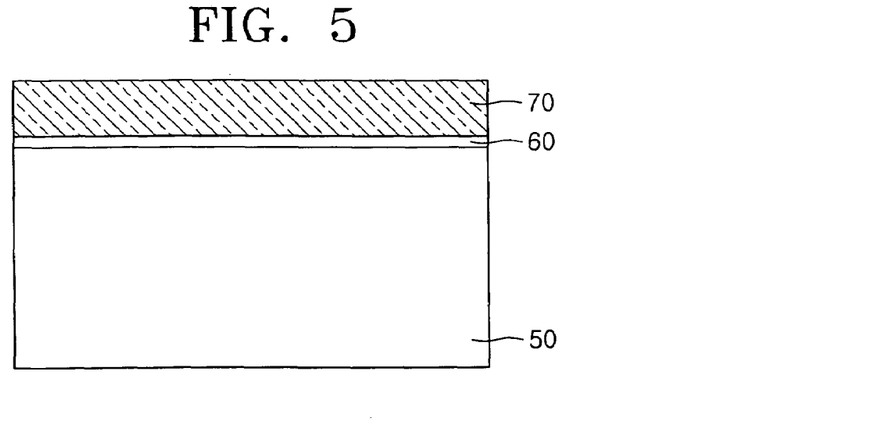
FIGS. 5 through 10 are cross-sectional views illustrating a method of fabricating a semiconductor device in accordance with another exemplary embodiment of the present invention.

Referring to FIG. 5, a field ion implantation region (not illustrated) and an element isolation layer (not illustrated) are consecutively formed on a semiconductor substrate 50 to define an active region and an inactive region. Shallow trench isolation (STI), which is well known in the art, may be formed in the element isolation layer. A thin buffer oxide layer 60 is formed on semiconductor substrate 50 on which the field ion implantation region and the element isolation layer are formed, and then channel adjusting ion implantation and surface source/drain ion implantation are performed in accordance with the depth of a trench that will be formed subsequently. In the illustrated embodiment, buffer oxide layer 60 is a silicon dioxide layer, which is a middle temperature oxide (MTO) and is formed using a conventional deposition method such as chemical vapor deposition (CVD), sub-atmospheric chemical vapor deposition (SACVD), low pressure chemical vapor deposition (LPCVD), or plasma enhanced chemical vapor deposition (PECVD).

Next, a hard mask layer 70 is formed on buffer oxide layer 60. In the illustrated embodiment, hard mask layer 70 comprises Si. Hard mask layer 70 may be formed by, for example, depositing Si or SiGe. The Si may be, for example, single crystal, polycrystal, or amorphous Si, and the SiGe may be, for example, single crystal, polycrystal, or amorphous SiGe. As described above, the Ge content of the silicon germanium (SiGe) can be varied as desired for each process. Since the SiGe is more readily etched as the Ge content of the SiGe increases, the Ge content of the SiGe can be increased (i.e., the Si content decreased) to simplify a process requiring hard mask layer 70 to be readily removed.

Figure 6:
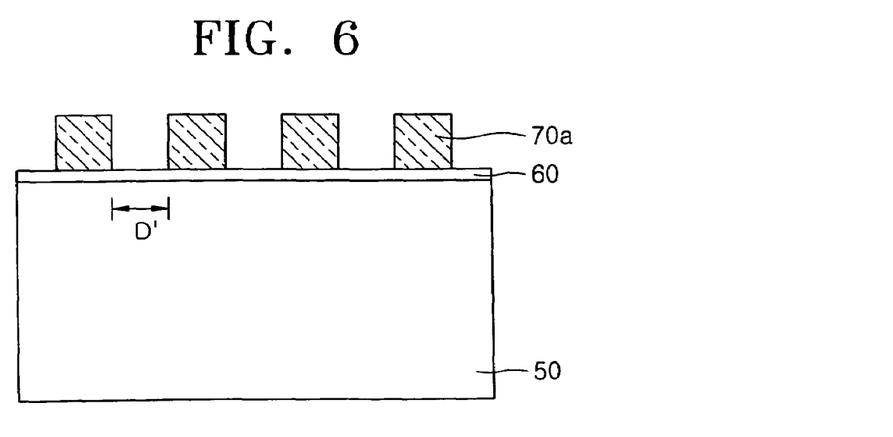

Referring to FIG. 6, hard mask layer 70 is etched to form hard mask patterns 70a, wherein adjacent hard mask patterns 70a are separated by a distance D' using a method substantially the same as the method described with reference to FIGS. 1 and 2.

Figure 7:
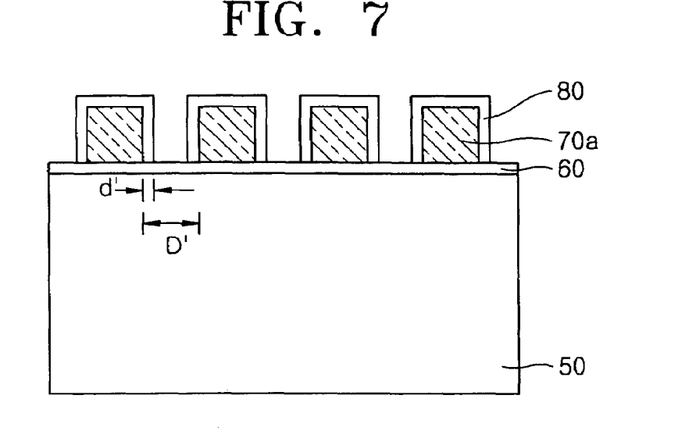

Referring to FIG. 7, material layers 80 covering the lateral and top surfaces of hard mask patterns 70a are formed such that each material layer 80 has a thickness of d'. Like material layers 40 (of FIG. 3), material layers 80 may be Si layers or SiGe layers formed using SEG. Openings O' are formed on semiconductor substrate 50 through the formation of material layers 80. The width of each opening O' is (D'–2d'), which is smaller than the distance between adjacent hard mask patterns 70a (i.e., distance D').

Figure 8:
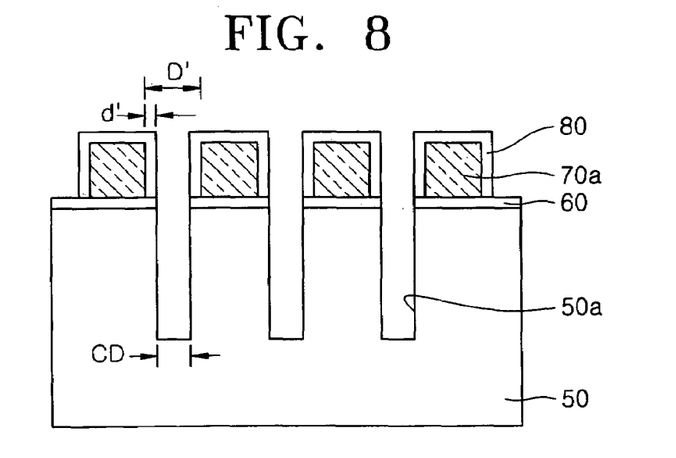

Referring to FIG. 8, buffer oxide layer 60 and semiconductor substrate 50 are etched using hard mask patterns 70a covered by material layers 80 as an etching mask to thereby form trenches 50a having depths of 1000 to 1500 Å in semiconductor substrate 50. In the illustrated embodiment, the etching is performed using conventional reactive ion etching (RIE). The etching gas used on semiconductor substrate 50 may comprise, for example, a chloride group gas, such as $Cl_2$ or $BCl_3$, or an inert gas such as He, Ne, or Ar for reproducibility of the etching profile. The CD of each of trenches 50a is (D'–2d'), which is smaller than the smallest CD than can be formed using photolithography, where distance D' is the smallest CD that can be formed using photolithography due to the upper limit of photolithography resolution.

Figure 9:
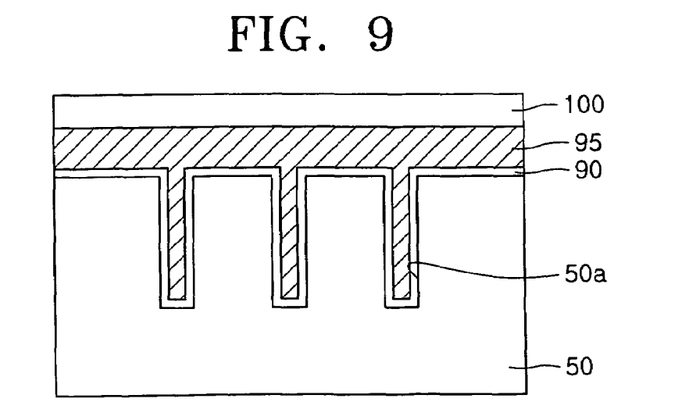

Referring to FIGS. 8 and 9, material layers 80 and hard mask patterns 70a are then removed. Etch-back, chemical mechanical polishing (CMP), chemical dry etching (CDE), dry etching, or wet etching can be used to remove material layers 80 and hard mask patterns 70a. CDE can be used to remove material layers 80 and hard mask patterns 70a uniformly. CDE is different from dry etching in that a semiconductor substrate to be etched is not biased, but rather the etching gas is activated in a radical state. Since the semiconductor substrate is biased during dry etching, the activated gas runs in the same direction to act on the semiconductor substrate, and thus, anisotropic etching is achieved. However, in CDE, the activated gas runs to a random direction to act uniformly on the entire surface of the semiconductor substrate, and thus a nearly isotropic etching can be performed using CDE. Therefore, CDE can provide more uniform etching than dry etching.

To prevent trenches 50a from being damaged by the etching process for removing material layers 80 and hard mask patterns 70a, a sacrificial oxide layer (not illustrated) is formed in trenches 50a through thermal oxidation. The sacrificial oxide layer and buffer oxide layer 60 may be removed through wet etching. Gate insulation layer 90 is a silicon dioxide layer, a titanium dioxide layer, or a tantalum oxide layer formed through thermal oxidation or deposition.

After material layers 80 and hard mask patterns 70a are removed, a gate insulation layer 90 is formed on the inner walls and the bottom of each trench 50a. Next, a gate conductive layer 95 is formed to fill trenches 50a. Gate conductive layer 95 may be formed by depositing a conductive polysilicon layer. The conductive polysilicon layer may be formed by depositing polysilicon without impurities, then implanting arsenic (As) ions or phosphorous (P) ions into the polysilicon to provide conductivity. Alternatively, the conductive polysilicon layer may be doped with impurities in-situ when the conductive polysilicon layer is deposited. The conductive polysilicon layer may be planarized through an etch-back or CMP process, and then a metal layer may be formed on the conductive polysilicon layer. The metal layer may be formed from, for example, tungsten (W), an Al/Cu alloy, or Cu, but is not limited to being formed from one of those materials. Each of those metals may be deposited using high-density inductively coupled plasma (ICP) deposition, high-density ionized metal plasma (IMP) deposition, sputtering, or CVD. Gate conductive layer 95 may be a stacked layer comprising a conductive polysilicon layer and a silicide layer, or gate conductive layer 95 may comprise only a conductive polysilicon layer. A capping layer 100 adapted to protect gate conductive layer 95 is formed by depositing an insulation material such as silicon nitride on gate conductive layer 95. The silicon nitride may be deposited using PECVD or LPCVD, and using a reaction of, for example, $SiH_4$ and $NH_3$ at a temperature of between 500° C. and 850° C.

Figure 10:
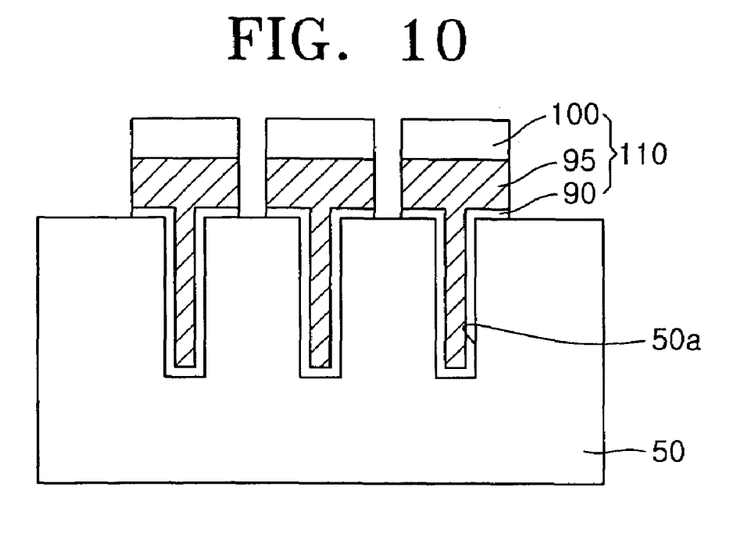

Referring to FIG. 10, capping layer 100, gate conductive layer 95, and gate insulation layer 90 are patterned using a gate mask (not illustrated) to thereby form buried gates 110 filling trenches 50a. Thus, an RCAT is formed.

Thus, in the process for forming an RCAT, a trench having a CD of less than 40 nm can be formed through the method described with reference to FIGS. 5 through 10. However, forming a trench having a CD of less than 40 nm in the process for forming an RCAT is impossible using a conventional photolithography method.

FIGS. 11 through 14 are cross-sectional views illustrating a method of fabricating a semiconductor device in accordance with yet another exemplary embodiment of the present invention. A method of forming an SAC in a DRAM will be described as an exemplary embodiment of the present invention with reference to FIGS. 11 through 14. Description of processes that are substantially the same as those described previously with reference to FIGS. 1 through 4 may be omitted here.

Figure 11:
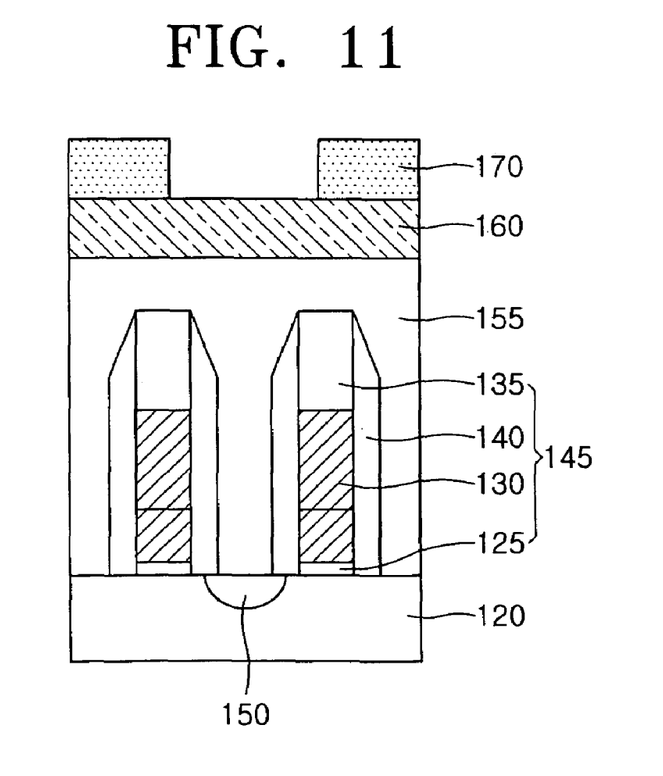
FIGS. 11 through 14 are cross-sectional views illustrating a method of fabricating a semiconductor device in accordance with yet another exemplary embodiment of the present invention; and, FIGS. 15 through 17 are cross-sectional views illustrating a method of fabricating a semiconductor device in accordance with still another exemplary embodiment of the present invention.

Referring to FIG. 11, gate electrodes 145 (i.e., adjacent gate electrodes 145) are formed on a semiconductor substrate 120. In the illustrated embodiment, each gate electrode 145 comprises a stacked layer comprising a gate insulation layer 125, a gate conductive layer 130, and a gate hard mask 135; and spacers 140 formed on the lateral surfaces of the stacked layer. Gate conductive layer 130 may comprise, for example, a double layer comprising polysilicon and tungsten (W). An impurity region 150 is formed between adjacent gate electrodes 145 using ion implantation. Next, an interlayer insulation layer 155 is formed on semiconductor substrate 120 and filling the gap between adjacent gate electrodes 145 formed on semiconductor substrate 120. Interlayer insulation layer 155 may be formed from, for example, silicon dioxide, undoped silicate glass (USG), phosphorus silicate glass (PSG), plasma enhanced-tetraethylorthosilicate (PE-TEOS), or spin on glass (SOG).

A hard mask layer 160 is formed on interlayer insulation layer 155. In the illustrated embodiment, hard mask layer 160 comprises Si. Hard mask layer 160 may be formed by, for example, depositing Si or SiGe. The Si may be, for example, single crystal, polycrystal, or amorphous Si, and the SiGe may be, for example, single crystal, polycrystal, or amorphous SiGe. The Ge content of the SiGe may vary in accordance with the process to be performed. As described above, the composition of the SiGe is not specifically fixed, but rather may be optimized for each process. Resist patterns 170 are formed on hard mask layer 160.

Figure 12:
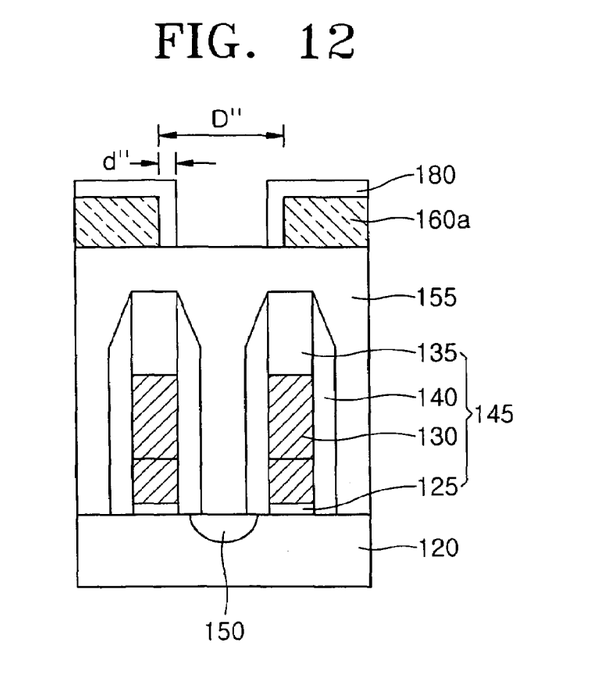

Referring to FIG. 12, hard mask layer 160 is etched using resist patterns 170 as an etching mask to form hard mask patterns 160a such that adjacent hard mask patterns 160a are separated by a distance D". Resist patterns 170 are then removed through ashing and stripping. Next, material layers 180 covering the lateral and top surfaces of hard mask patterns 160a are formed such that each material layer 180 has a thickness d". Material layers 180 may be Si layers or SiGe layers formed using SEG. Openings O" are formed on semiconductor substrate 120 through the formation of material layers 180. The width of each opening O" is (D"−2d"), which is smaller than the distance between adjacent hard mask patterns 160a (i.e., distance D").

Figure 13:
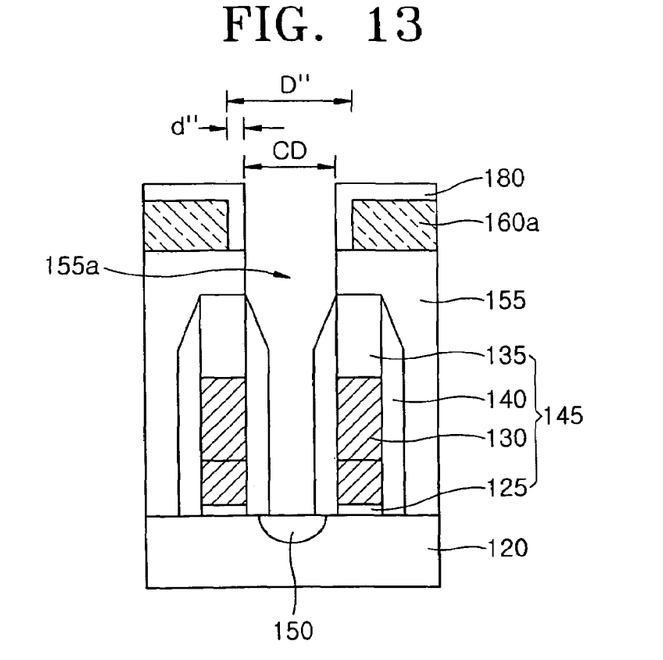

Referring to FIG. 13, interlayer insulation layer 155 is then etched using hard mask patterns 160a covered by material layers 180 as an etching mask to form a self aligned contact hole 155a between adjacent gate electrodes 145. The CD of self aligned contact hole 155a is (D"−2d"). Therefore, even when distance D" corresponds to the smallest CD that can be formed through photolithography due to the upper limit of photolithography resolution, the CD of self aligned contact hole 155a is smaller than distance D".

Figure 14:
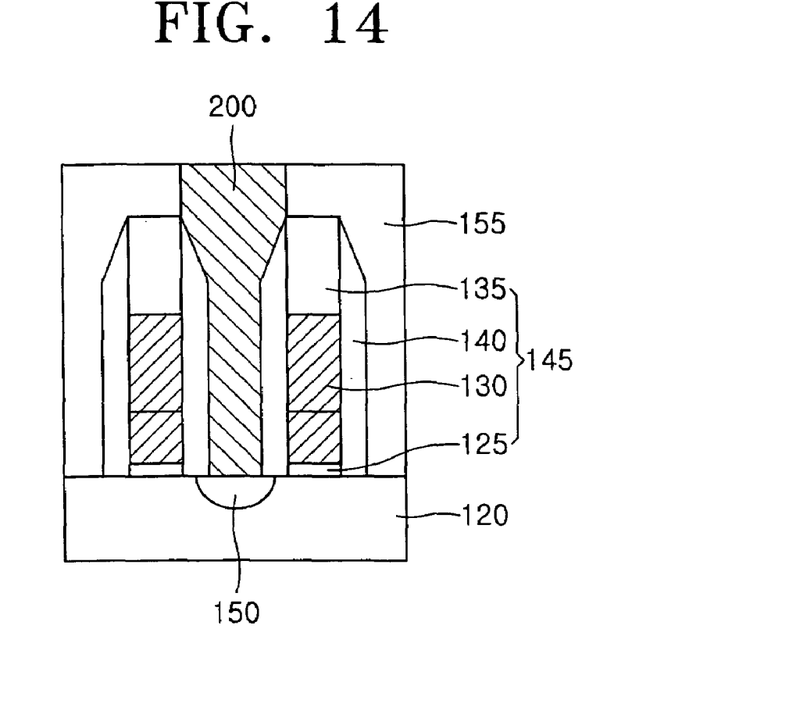

Referring to FIGS. 13 and 14, self aligned contact hole 155a is filled with a conductive layer, thereby forming a contact plug 200 that makes contact with impurity region 150.

In accordance with the exemplary embodiment described with reference to FIGS. 11 through 14, a contact hole, having a CD smaller than can be produced using photolithography, can be formed in a process for forming an SAC.

Figure 15:
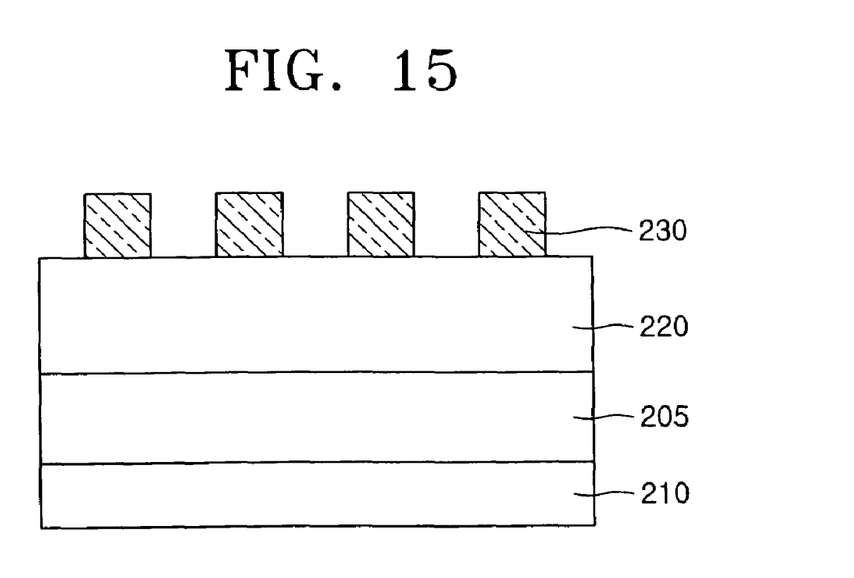
Figure 16:
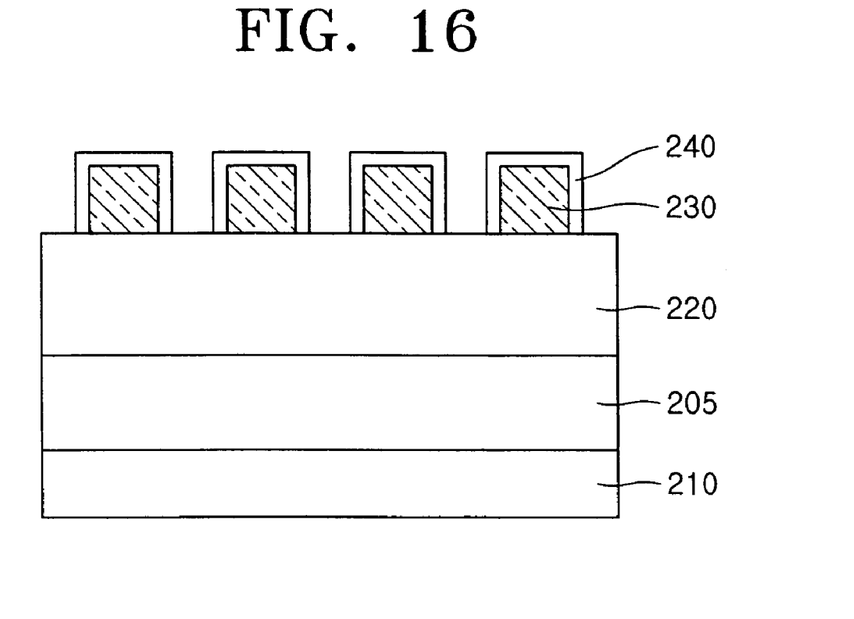
Figure 17:
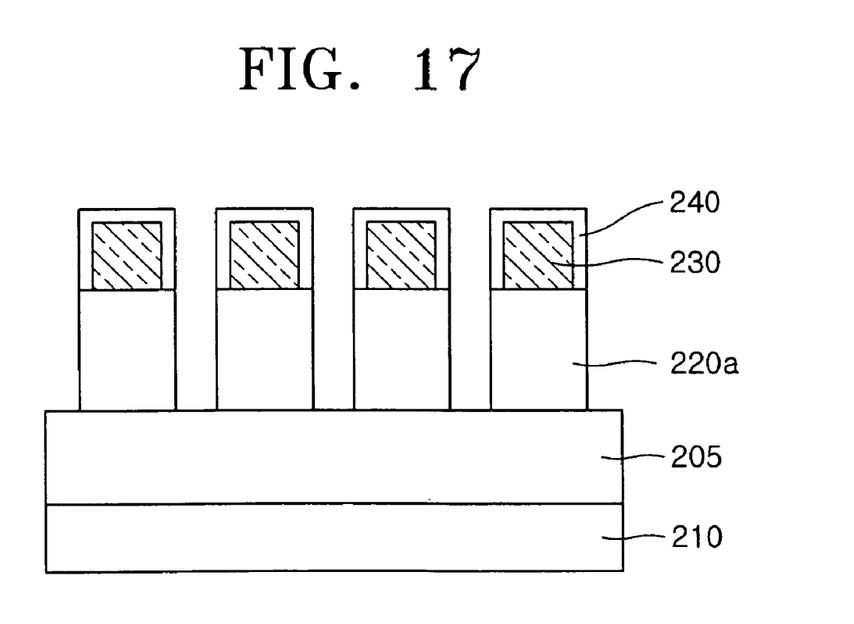

FIGS. 15 through 17 are cross-sectional views illustrating a method of fabricating a semiconductor device in accordance with still another exemplary embodiment of the present invention. A method of using a silicon nitride layer as a hard mask pattern will be described as an exemplary embodiment of the present invention with reference to FIGS. 15 through 17. Description of processes that are substantially the same as those described previously with reference to FIGS. 1 through 4 may be omitted here.

Referring to FIG. 15, an etching target layer 205 is formed on a semiconductor substrate 210, a silicon nitride layer 220 is formed on etching target layer 205, and line and space type hard mask patterns 230 are formed on silicon nitride layer 220. Hard mask patterns 230 can be formed using methods described in relation to previously described exemplary embodiments.

Referring to FIG. 16, material layers 240 covering lateral and top surfaces of hard mask patterns 230 are formed. Material layers 240 may be Si layers or SiGe layers formed using SEG. Openings O''' are formed on semiconductor substrate 210 through the formation of material layers 240. The width of each opening O' is smaller than the distance between adjacent hard mask patterns 230.

Referring to FIGS. 16 and 17, silicon nitride layer 220 is etched using hard mask patterns 230 covered by material layers 240 as an etching mask to form silicon nitride layer patterns 220a. Then, etching target layer 205 is etched using silicon nitride layer patterns 220a and hard mask patterns 230 covered by material layers 240 as an etching mask.

Accordingly, hard mask patterns 230 and material layers 240 covering the lateral and top surfaces of hard mask patterns 230 are used in a process for etching other hard mask layer materials. In the embodiment illustrated in FIGS. 15 through 17, silicon nitride layer 220 is used as a hard mask layer that is etched into hard mask patterns; however, an $SiO_2$, $Al_2O_3$, or $Ta_2O_5$ layer, for example, may be used as a hard mask layer that is etched into hard mask patterns instead of silicon nitride layer 220.

As described above, by using a method in accordance with the present invention, a CD can be produced that is smaller than the smallest CD that can be produced using photolithography. That is, a CD of distance D, which corresponds to the upper limit of photolithography resolution, minus twice the thickness d of a material layer can be produced in accordance with the present invention by forming hard mask patterns such that adjacent hard mask patterns are separated by a distance D and forming a material layer to cover each hard mask pattern.

In other words, an etching mask formed through a method in accordance with the present invention comprises hard mask patterns and material layers covering the lateral and top surfaces of the hard mask patterns. The width of each opening formed in the etching mask is smaller than the distance between adjacent hard mask patterns formed through a photolithography process by twice the thickness of the material layer. Therefore, when a semiconductor base material is etched using an etching mask formed through a method in accordance with the present invention, an opening that is smaller than the smallest opening that can be formed through a photolithography process, due to the lower limit of photography resolution, can be formed in the semiconductor base material.

Since the widths of the openings formed in the etching mask are reduced through the formation of the material layers, the etching process is more precise when the material layers are formed on the hard mask patterns.

As described above, a method in accordance with the present invention can be used to reduce a space CD through the growth of an epi-layer comprising Si or SiGe on a hard mask pattern formed from Si or SiGe, and easily control the CD by controlling the thickness to which the epi-layer is grown. Consequently, the method can be advantageously applied to the fabrication of a highly integrated semiconductor device having a fine isolation width, such as a contact hole or a trench.

While the present invention has been described with reference to exemplary embodiments, it will be understood by those of ordinary skill in the art that various changes in form and detail may be made to the exemplary embodiments without departing from the scope of the present invention as defined by the following claims.

What is claimed is:

1. A method of fabricating a semiconductor device comprising:
   forming hard mask patterns form a layer of silicon or silicon germanium on a semiconductor base material;
   forming material layers from silicon or silicon germanium to cover the lateral and top surfaces of the hard mask patterns to form openings that expose a portion of the semiconductor base material between adjacent hard mask patterns, wherein the width of each opening is smaller than the distance between adjacent hard mask patterns; and,
   etching the semiconductor base material using the hard mask patterns and material layers covering the lateral and top surfaces of the hard mask patterns as an etching mask.

2. The method of claim 1, wherein the Si is single crystal, polycrystal, or amorphous Si, and the SiGe is single crystal, polycrystal, or amorphous SiGe.

3. The method of claim 1, wherein the layer from which the hard mask patterns are formed is SiGe, and the material layers are formed from SiGe.

4. The method of claim 1, wherein the Si layer or the SiGe layer is formed using an selective epitaxial growth (SEG) process.

5. The method of claim 1, wherein etching the semiconductor base material comprises forming a groove in the semiconductor base material.

6. The method of claim 1, wherein:
   the semiconductor base material comprises a semiconductor substrate and a buffer oxide layer formed on the semiconductor substrate; and,
   etching the semiconductor base material comprises forming a trench in the semiconductor substrate.

7. The method of claim 6, further comprising forming a buried gate in the trench.

8. The method of claim 1, wherein:
   the semiconductor base material comprises an interlayer insulation layer filling the region between adjacent gate electrodes formed on a semiconductor substrate; and,
   etching the semiconductor base material comprises forming a self aligned contact hole between the adjacent gate electrodes disposed in the interlayer insulation layer.

9. The method of claim 8, further comprising forming a contact plug in the self aligned contact hole.

10. The method of claim 1, wherein:
    the hard mask patterns are line and space mask patterns;
    the semiconductor base material comprises an etching target layer and a silicon nitride layer formed on the etching target layer; and,
    etching the semiconductor base material comprises:
       etching the silicon nitride layer; and,
       etching the etching target layer using the hard mask patterns, material layers, and the etched silicon nitride layer as an etching mask.

11. The method of claim 1, wherein the material layers have uniform thicknesses on the lateral and top surfaces of the hard mask patterns.

12. The method of claim 1, wherein forming hard mask patterns comprises:
    forming a hard mask layer on the semiconductor base material;
    forming resist patterns on the hard mask layer;
    etching the hard mask layer using the resist patterns as an etching mask; and,
    removing the resist patterns.

13. A method of fabricating a semiconductor device comprising:
    forming hard mask patterns from a layer of semiconductor material comprising silicon formed on a semiconductor base material;
    forming material layers from material substantially similar to the layer of semiconductor material to cover the lateral and top surfaces of the hard mask patterns using SEG to form openings between adjacent hard mask patterns, wherein the width of each opening is smaller than the distance between adjacent hard mask patterns; and,
    etching the semiconductor base material using the hard mask patterns and material layers as an etching mask.

14. The method of claim 13, wherein the layer of semiconductor material from which the hard mask patterns are formed Si or SiGe.

15. The method of claim 14, wherein the Si is single crystal, polycrystal, or amorphous Si.

16. The method of claim 14, wherein the SiGe is single crystal, polycrystal, or amorphous SiGe.

* * * * *